United States Patent [19]
Badaye et al.

[11] Patent Number: 5,650,376
[45] Date of Patent: Jul. 22, 1997

[54] (ND, BA)$_3$CU$_3$O$_{7-D}$ SUPERCONDUCTOR FILM

[75] Inventors: Massoud Badaye, Otawa, Canada; Tadataka Morishita, Kanagawa-ken, Japan; Youichi Enomoto; Shoji Tanaka, both of Tokyo, Japan

[73] Assignee: International Superconductivity Technology Center, Japan

[21] Appl. No.: 554,585

[22] Filed: Nov. 6, 1995

[30] Foreign Application Priority Data

Nov. 7, 1994 [JP] Japan .................................. 6-272746

[51] Int. Cl.$^6$ ........................................................ B32B 9/00
[52] U.S. Cl. ........................ 505/238; 505/125; 505/126; 505/701; 428/930; 427/62
[58] Field of Search .................................. 505/125, 126, 505/238, 701; 427/62; 428/930

[56] References Cited

U.S. PATENT DOCUMENTS 5,149,684 9/1992 Woolf et al. .................................. 505/1

FOREIGN PATENT DOCUMENTS 4-258171 9/1992 Japan .

OTHER PUBLICATIONS

Applied Physics Letters, 1 Aug. 1994, vol. 65, No. 5, pp. 633–635.

Patent Abstracts of Japan, vol. 013 No. 427 22, Sep. 1989.

*Primary Examiner*—Roy V. King
*Attorney, Agent, or Firm*—Lorusso & Loud

[57] ABSTRACT

A superconducting film is disclosed which has the following composition:

$$(Nd, Ba)_3Cu_3O_{7-d}$$

where d is a number greater than 0 but smaller than 0.5. The superconducting film has the same crystal structure as that of YBa$_2$Cu$_3$O$_7$ except that part of the Nd sites and/or part of the Ba sites are occupied by Ba and Nd atoms, respectively.

4 Claims, 8 Drawing Sheets

(ND, BA)$_3$CU$_3$O$_{7-D}$ SUPERCONDUCTOR FILM

BACKGROUND OF THE INVENTION

This invention relates to a superconducting metal oxide film and a method of preparing same.

REBa$_2$Cu$_3$O$_7$ (RE: Y or a rare earth element) metal oxide superconductors are known to have a common crystal structure and are generally termed 123 superconductor materials. Typical example of such a superconductor is YBa$_2$Cu$_3$O$_7$. Among various 123 superconductor materials, a bulk of NdBa$_2$Cu$_3$O$_{7-d}$ prepared by an OCMG (oxygen controlled melt growth) method is known to exhibit an excellent critical current density (Jc characteristics) in a high magnetic field. A superconducting film of NdBa$_2$Cu$_3$O$_{7-d}$ prepared by an MBE (molecular beam epitaxy) method is disclosed in Appl. Phys. Lett. 57 (26), p2850–2852 (1990). A method of producing a c-axis oriented film of NdBa$_2$Cu$_3$O$_{7-d}$ by the MBE method utilizing NO$_2$ as an oxidizing gas is disclosed in Appl. Phys. Lett. 59 (5), p600–602 (1991).

One serious problem of the known NdBa$_2$Cu$_3$O$_{7-d}$ superconducting film is that the superconductive critical temperature Tc (resistance: zero) thereof is as low as about 30 K.

SUMMARY OF THE INVENTION

It is, therefore, an object of the present invention to provide a superconducting metal oxide film which is composed of Nd, Ba, Cu and O, which has a crystal structure similar to YBa$_2$Cu$_3$O$_7$ and which has a superconductive critical temperature Tc of higher than the liquid nitrogen.

Another object of the present invention is to provide a method which can prepare the above superconducting metal oxide film.

In accomplishing the foregoing objects, there is provided in accordance with the present invention a superconducting film having the following composition:

$$(Nd, Ba)_3Cu_3O_{7-d}$$

where d is a number greater than 0 but smaller than 0.5 and having the same crystal structure as that of YBa$_2$Cu$_3$O$_7$, wherein part of the Nd sites and/or part of the Ba sites are occupied by Ba and Nd atoms, respectively.

In another aspect, the present invention provides a process for the preparation of the above superconducting film, wherein said substrate is subjected to a pulsed laser deposition using a sintered body of NdBa$_2$Cu$_3$O$_z$ where z is a number greater than 6 but not greater than 7 as a target while maintaining said substrate at a temperature of between 650° C. and 850° C. and in the atmosphere having an oxygen pressure of between 50 mTorr and 300 mTorr.

The present invention also provides a process for the preparation of the above superconducting film, wherein said substrate is subjected to a high frequency sputtering using a sintered body of NdBa$_2$Cu$_3$O$_z$ where z is a number greater than 6 but not greater than 7 as a target while maintaining said substrate at a temperature of between 660° C. and 760° C. and in the atmosphere having a total pressure of argon and oxygen of between 50 mTorr and 140 mTorr and a volume ratio of argon to oxygen of between 1:1 and 4:1.

BRIEF DESCRIPTION OF THE DRAWINGS

Other objects, features and advantages of the present invention will become apparent from the detailed description of the preferred embodiments which follow, when considered in light of the accompany drawings, in which.

DETAILED DESCRIPTION OF THE PREFERRED EMBODIMENTS OF THE INVENTION

Figure 1:
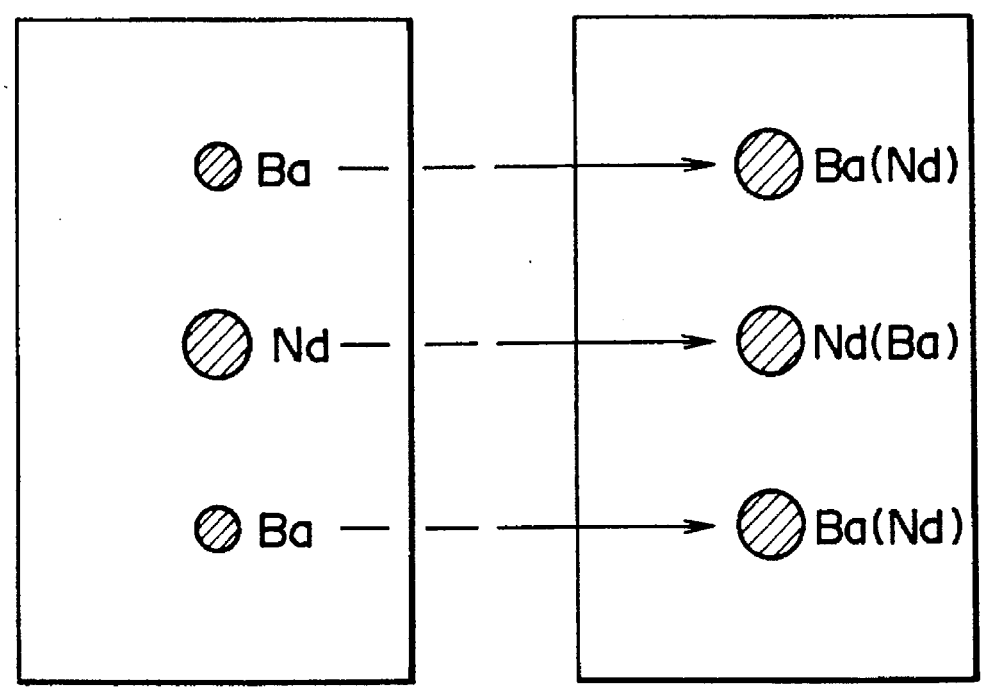
FIG. 1 is a schematic illustration explanatory of the crystal structure of the superconducting film according to the present invention.

As schematically shown in FIG. 1, the superconducting film according to the present invention has the same crystal structure as that of a 123 superconductor material, typically YBa$_2$Cu$_3$O$_7$. Further, the total molar amounts of Nd and Ba of the superconducting film of the present invention relative to the amount of Cu is the same as that of NdBa$_2$Cu$_3$O$_7$. However, the superconducting film of the present invention is clearly distinguished from the known NdBa$_2$Cu$_3$O$_7$ film in that Ba atoms are substituted for part of the Nd sites and/or Nd atoms are substituted for part of the Ba sites in the inventive superconducting film. Thus, the composition of the superconducting film according to the present invention is expressed as (Nd, Ba)$_3$Cu$_3$O$_{7-d}$ where d is a number greater than 0 but smaller than 0.5.

Preferably, the superconducting film has the following composition:

$$Nd_{1+x}Ba_{2-x}Cu_3O_{7-d}$$

wherein x and d are numbers satisfying the following conditions:

$$0.03 < x < 0.12$$

$$0 < d < 0.5.$$

The superconducting film may be prepared by a pulsed laser deposition method or a high frequency sputtering method.

In the pulsed laser deposition method, a substrate of a single crystal such as SrTiO$_3$, NdGaO$_3$, LaAlO$_3$ or MgO is subjected to vacuum deposition using a sintered body of NdBa$_2$Cu$_3$O$_z$ (where z is a number greater than 6 but not greater than 7) as a target. The substrate is maintained at a temperature of between 650° C. and 850° C. and in the atmosphere having an oxygen pressure of between 50 mTorr (5×1.333 Pa) and 300 mTorr (30×1.333 Pa).

In the high frequency sputtering deposition method, a substrate of a single crystal such as $SrTiO_3$, $NdGaO_3$, $LaAlO_3$ or MgO is subjected to sputtering deposition using a sintered body of $NdBa_2Cu_3O_z$ (where z is a number greater than 6 but not greater than 7) as a target. The substrate is maintained at a temperature of between 660° C. and 760° C. and in the atmosphere having a total pressure of argon and oxygen of between 50 mTorr (5×1.333 Pa) and 140 mTorr (14×1.333 Pa) and a volume ratio of argon to oxygen of between 1:1 and 4:1.

The thus prepared $(Nd, Ba)_3Cu_3O_{7-d}$ superconducting film has a superconducting critical temperature Tc (R=0) of higher than the liquid nitrogen temperature, generally between 77 K. and 96 K and a thickness of, for example, 100–1,000 Å. The c-axis length of the film is preferably greater than 11.70 Å but smaller than 11.77 Å.

The superconducting film according to the present invention also has an advantage because the surface thereof is chemically stable. This characteristic is confirmed by good reproducibility of ρ-T curves (temperature dependency of specific resistance) as well as the spiral growth observed by ATM analysis (atomic force microscopic analysis). The surface grain density of the film is generally smaller than $10^5/mm^2$.

The following examples will further illustrate the present invention.

EXAMPLE 1

A substrate of a $SrTiO_3$ single crystal was disposed within a vapor deposition chamber together with a target. The target was a sintered body of $NdBa_2Cu_3O_z$ (6<z≦7) and disposed at a position spaced apart a distance of 5 cm from the substrate. The substrate was heated by radiation from a heater at a temperature of 650°–850° C. in an oxygen atmosphere having an oxygen pressure of 50°–300° mTorr. The distance between the substrate and the heater was maintained at 3 mm. The target was irradiated with pulsed ArF eximer laser 5,000 times at 5 Hz so that a superconductive thin film was deposited on the surface of the substrate. The energy density of the ArF eximer laser at a position of the surface of the target was varied in the range of 2.0–4 J/cm². After completion of the laser beam deposition, the actuation of the heater was stopped and the substrate was allowed to spontaneously cooled. The above operation was repeated at various oxygen pressures of 50, 75, 100, 200 and 300 mTorr and at various temperatures.

Each of the thus obtained superconducting film was measured for the crystallinity thereof by X-ray diffraction analysis, for the construction thereof by inductively coupled plasma spectroscopy and for the conductive characteristics thereof by a four-terminal method.

Figure 2:
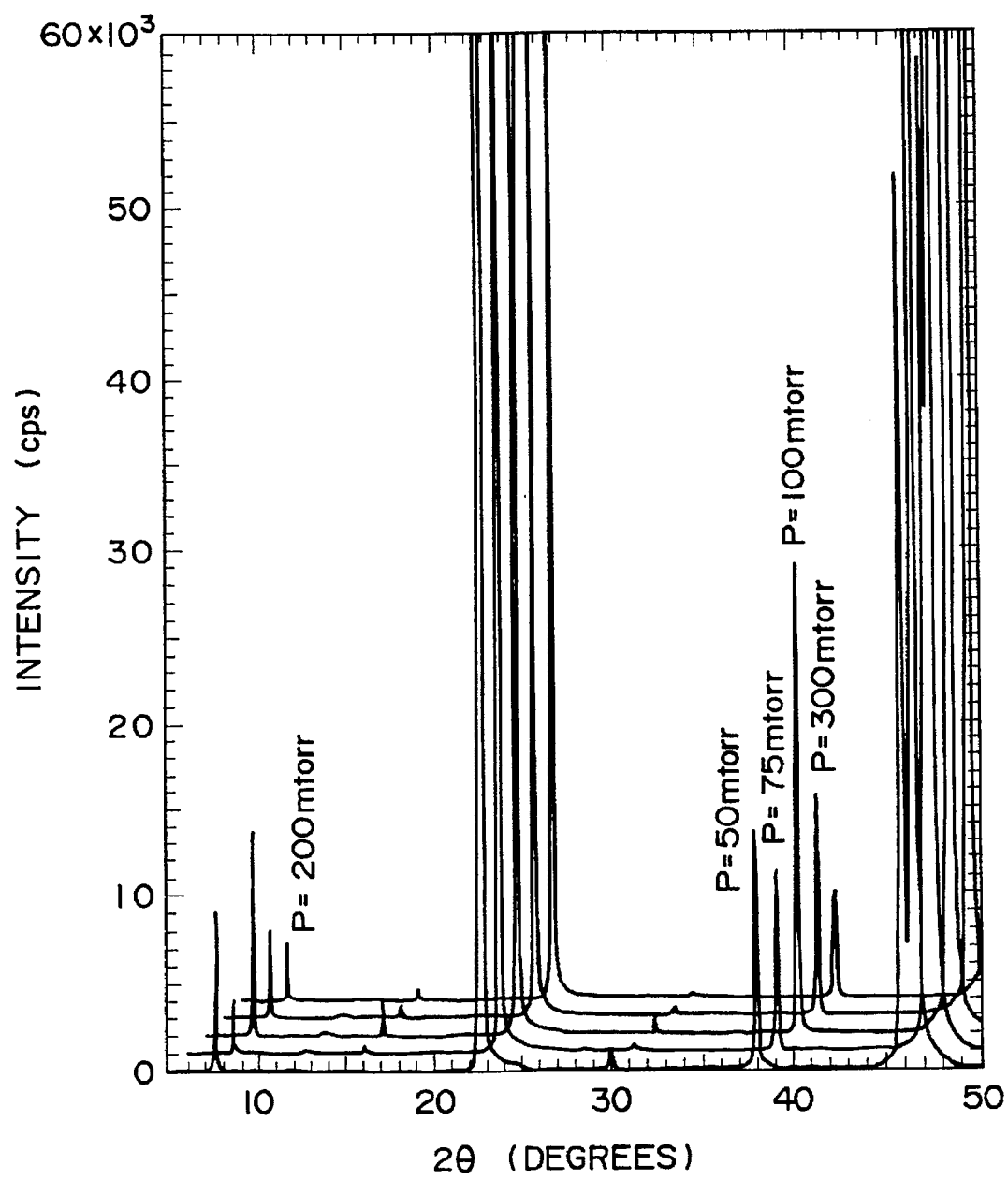
FIG. 2 is an X-ray diffraction pattern of the superconducting film of Example 1 according to the present invention.

FIG. 2 shows X-ray diffraction patterns of the above superconducting films obtained at a determined deposition temperature of 850° C. As will be appreciated from FIG. 2, the crystallinity of the superconducting films is similar to that of the substrate and no impurity phases are observed.

Figure 3:
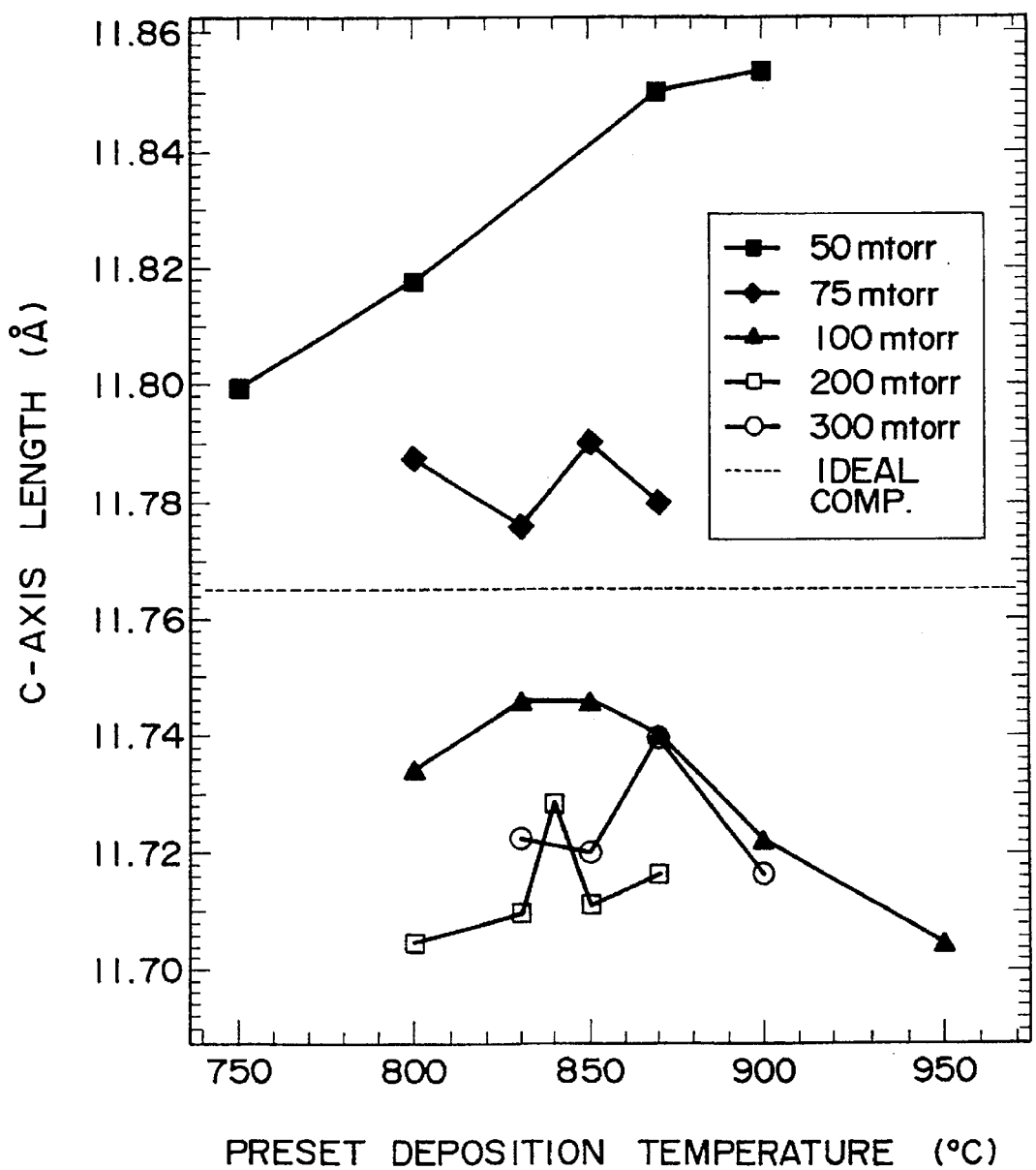
FIG. 3 shows the dependency of the length of the c-axis of the superconducting film of Example 1 upon the deposition temperature at various oxygen pressures.

FIG. 3 shows a relationship between the c-axis length of the superconducting film and the preset deposition temperature at various oxygen pressures. The results of FIG. 3 indicates that the c-axis length depends not only on the deposition temperature but also on the oxygen pressure. The actual temperature of the substrate (t1) is calculated according to the following equation in which t2 represents the preset deposition temperature.

$$t1 = t2 - 100 \,(°C.)$$

Figure 4:
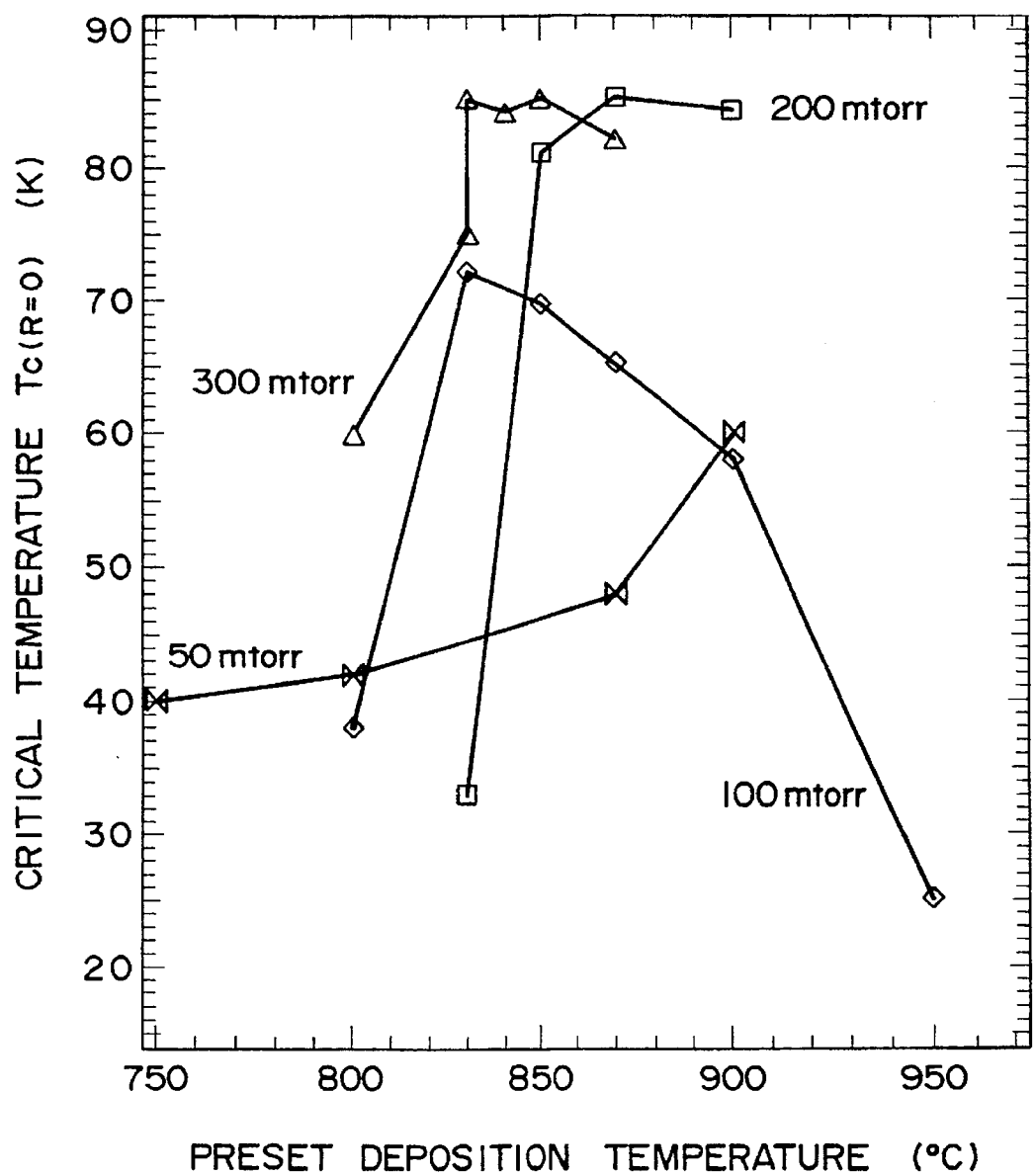
FIG. 4 shows the dependency of the superconductive critical temperature of the superconductive film of Example 1 upon the deposition temperature at various oxygen pressures.

FIG. 4 shows a relationship between the superconducting critical temperature Tc (resistance=0) and the preset deposition temperature. The results shown in FIG. 4 indicate that the critical temperature Tc greatly depends on the oxygen pressure and that a high Tc is obtainable at an oxygen pressure of between 200–300 mTorr.

Figure 5:
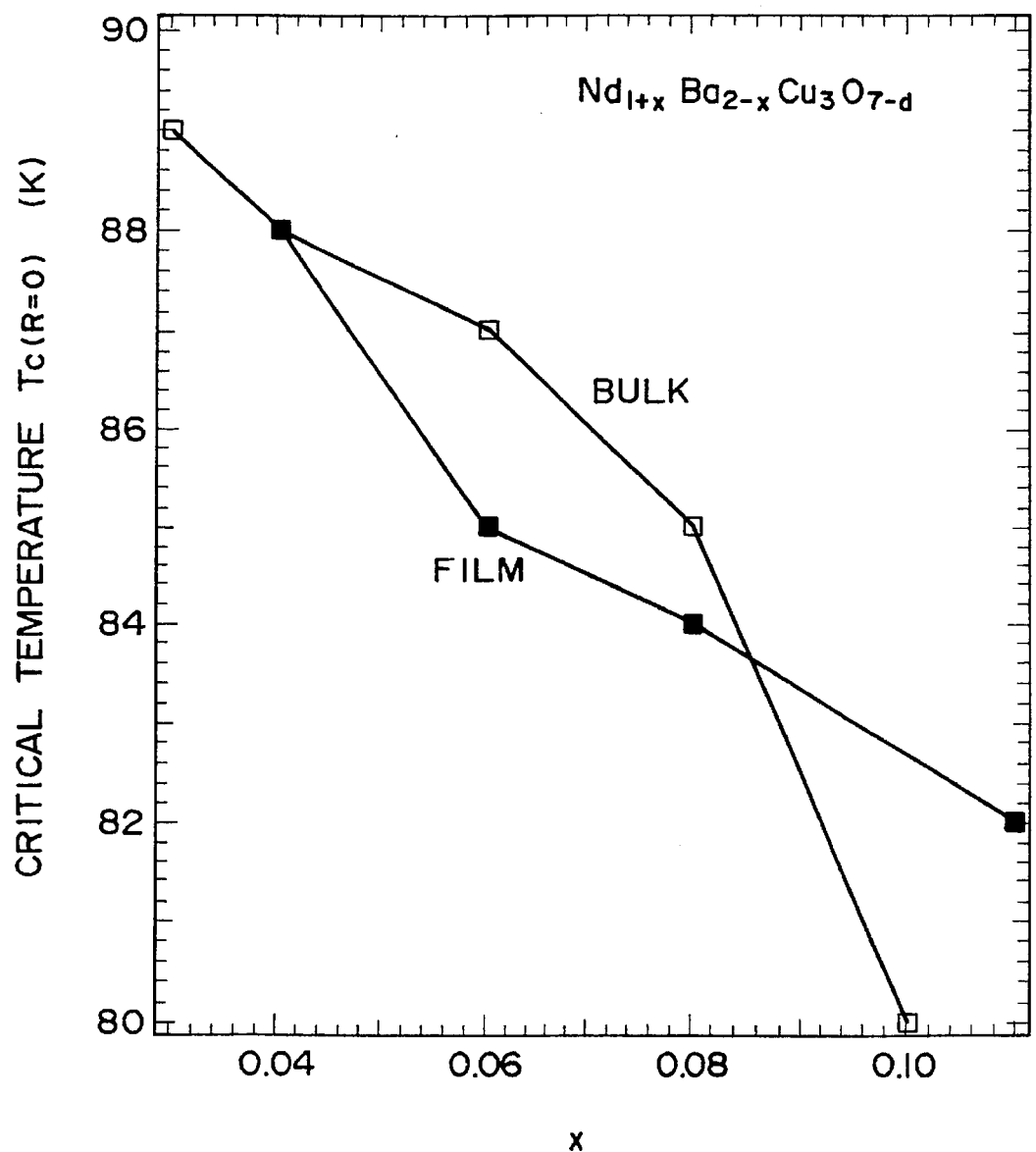
FIG. 5 shows a relationship between the superconducting critical temperature Tc and the number x when the composition formula of the superconducting film is expressed as Nd$_{1+x}$Ba$_{2-x}$Cu$_3$O$_{7-d}$.

FIG. 5 shows a relationship between the superconducting critical temperature Tc (resistance=0) and the number x when the composition formula of the superconducting film is expressed as $Nd_{1+x}Ba_{2-x}Cu_3O_{7-d}$. A high Tc is obtainable when x is greater than 0.03 but smaller than 0.12.

Figure 6:
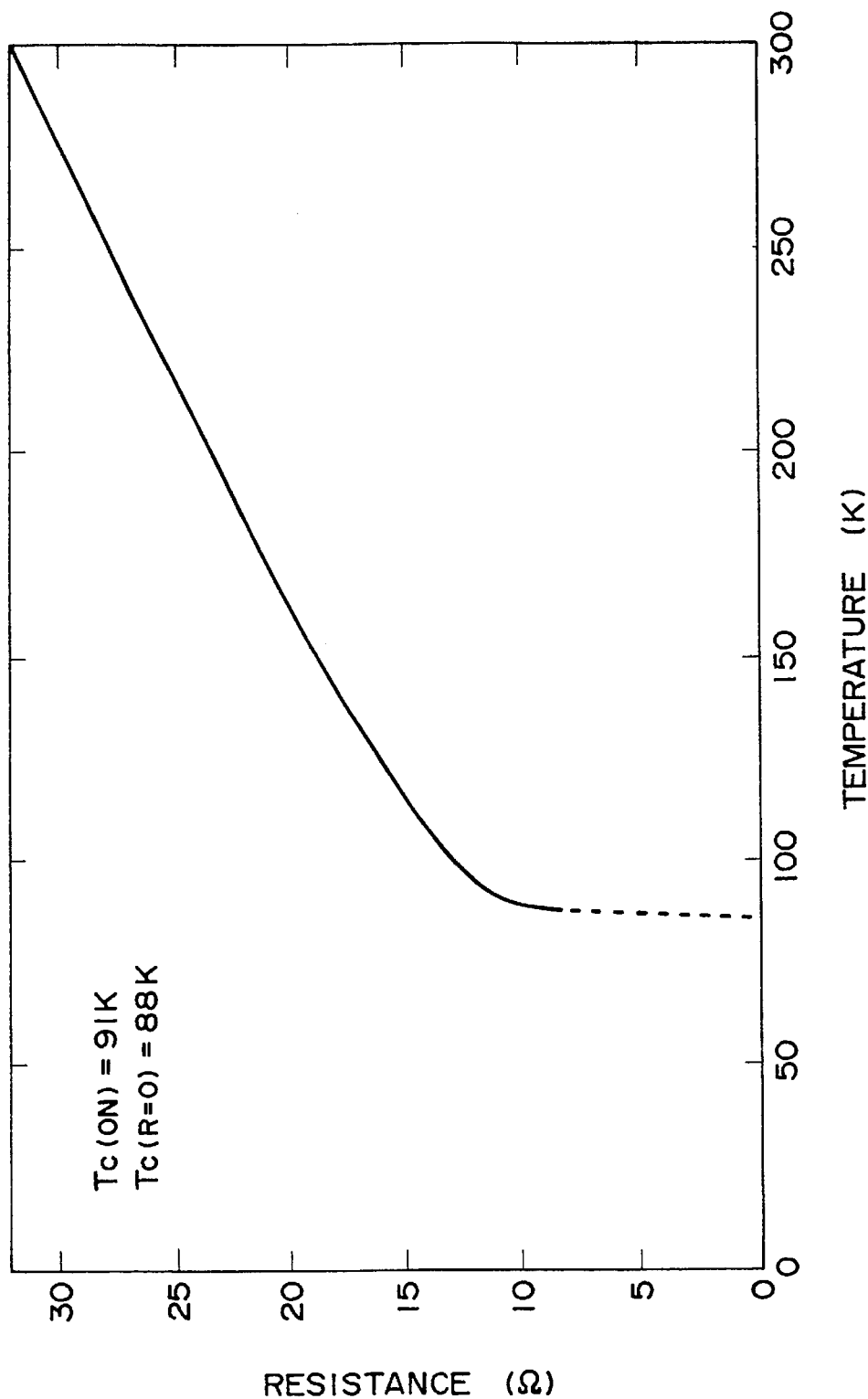
FIG. 6 shows temperature dependency of the superconducting critical temperature Tc of the superconducting film of Example 1.

FIG. 6 shows the temperature dependency of the electrical resistance of the superconducting film measured by a four-terminal method. Superconductivity starts at 91 K. and the resistance is zero at 88 K. It was found that the temperature dependency of the electrical resistance was able to be measured with good reproducibility. An atomic force microscopic analysis (ATM) of the superconducting films revealed that the surface of the films was stable. Thus, when the superconducting films was allowed to stand in air for 2 weeks, no surface deterioration was observed and no change of the ρ-T characteristic curve was observed.

EXAMPLE 2

A substrate of a MgO single crystal was disposed within a sputtering chamber together with a target. The target was a sintered body of $NdBa_2Cu_3O_z$ (6<z=7) and fixed to a Cu packing plate. The substrate was heated at a temperature of 660°–760° C. in an oxygen atmosphere having a total pressure of argon and oxygen of between 50 mTorr (5×1.333 Pa) and 140 mTorr (14×1.333 Pa) and a volume ratio of argon to oxygen of between 1:1 and 4:1. The target was sputtered using a high frequency wave of 13.65 MHz at 60 W so that a superconductive thin film was deposited on the surface of the substrate at a deposition rate of 4 nm/minute. The off axis high frequency (RF) sputtering method is well known in the art and is disclosed in, for example, "Sputtering Technique" by Kiyotaka Sawa et al (edited by Kyoritsu Shuppan Inc. page 153 (1988).

Figure 7:
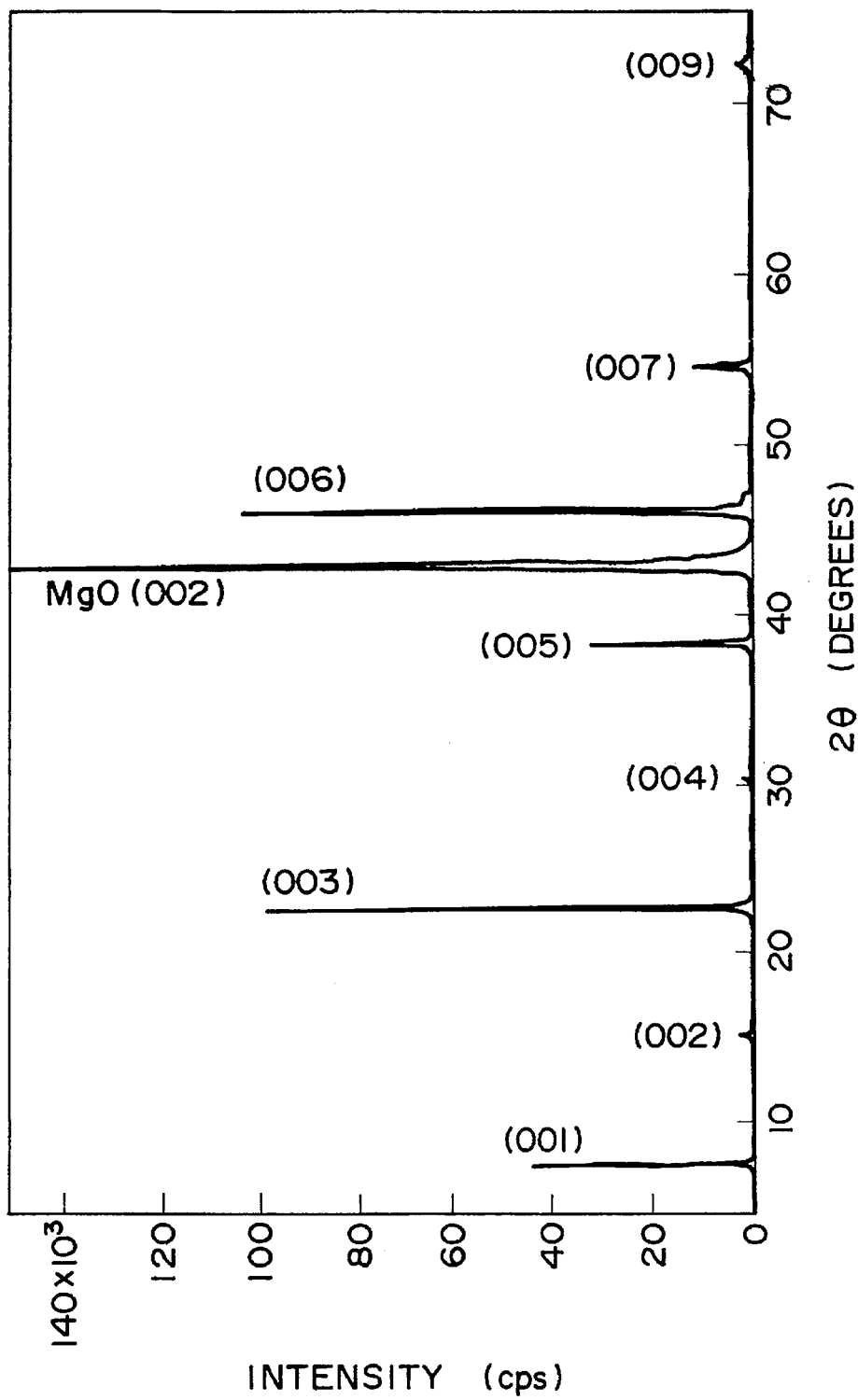
FIG. 7 is an X-ray diffraction pattern of the superconducting film of Example 2 according to the present invention.

FIG. 7 shows an X-ray diffraction pattern of the thus prepared superconducting film. This pattern suggests that the film is oriented in the direction of the c-axis. The analysis of the film by RHEED revealed streak patterns, suggesting that the crystal axis is oriented in the plane.

Figure 8:
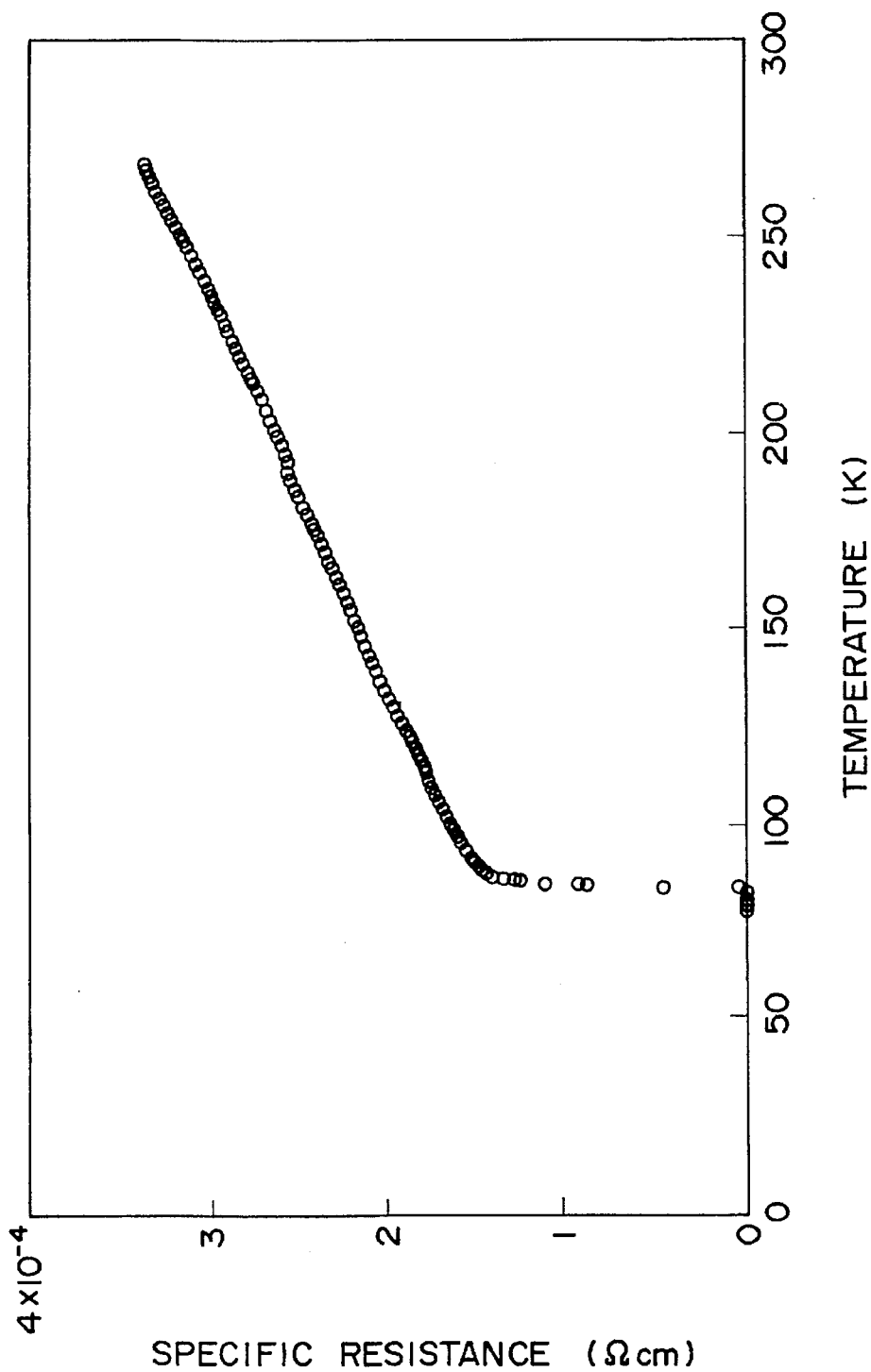
FIG. 8 shows temperature dependency of the superconducting critical temperature Tc of the superconducting film of Example 2.

FIG. 8 shows temperature dependency of the electrical resistance of the film, which was measured by the four-terminal method. The resistance became zero at the critical temperature Tc of 84 K. The conversion into the superconductive state occurred in a narrow temperature range. The intrinsic electrical resistance of the film was $10^{-4}$ Ωcm.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A superconducting film formed on a substrate and having a superconducting critical temperature Tc of between 77 K. and 96 K. and having the following composition:

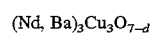

where d is a number greater than 0 but smaller than 0.5, said superconducting film having Nd and Ba sites and the same crystal structure as that of $YBa_2Cu_3O_7$, wherein part of the Nd sites are occupied by Ba atoms and/or part of the Ba sites are occupied by Nd atoms.

2. A superconducting film as claimed in claim 1, having a c-axis length of greater than 11.70 Å but smaller than 11.77 Å.

3. A superconducting film as claimed in claim 1, wherein the substrate is a single crystal selected from $SrTiO_3$, $NdGaO_3$ and MgO.

4. A superconducting film as claimed in claim 1, having the following composition:

$$Nd_{1+x}Ba_{2-x}Cu_3O_{7-d}$$

wherein X and d are numbers satisfying the following conditions:

$$0.03 < x < 0.12$$

$$0 < d < 0.5.$$

* * * * *